US008634268B2

(12) United States Patent
Lee et al.

(10) Patent No.: US 8,634,268 B2
(45) Date of Patent: Jan. 21, 2014

(54) MEMORY CIRCUIT HAVING DECODING CIRCUITS AND METHOD OF OPERATING THE SAME

(75) Inventors: Cheng Hung Lee, Hsinchu (TW); Hsu-Shun Chen, Toufen Town (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 502 days.

(21) Appl. No.: 12/912,971

(22) Filed: Oct. 27, 2010

(65) Prior Publication Data
US 2012/0106286 A1 May 3, 2012

(51) Int. Cl.
*G11C 8/10* (2006.01)

(52) U.S. Cl.
USPC .................. 365/230.06; 365/230.03

(58) Field of Classification Search
USPC ......................... 365/230.03, 230.06
See application file for complete search history.

(56) References Cited

U.S. PATENT DOCUMENTS

| 4,870,619 | A | * | 9/1989 | Van Ness | 365/208 |
| 5,497,351 | A | * | 3/1996 | Oowaki | 365/230.03 |
| 5,537,576 | A | * | 7/1996 | Perets et al. | 711/150 |
| 5,742,554 | A | * | 4/1998 | Fujioka | 365/222 |
| 5,933,377 | A | * | 8/1999 | Hidaka | 365/200 |
| 6,014,340 | A | * | 1/2000 | Sawada | 365/230.06 |
| 6,188,631 | B1 | * | 2/2001 | Lee et al. | 365/230.03 |
| 6,198,667 | B1 | * | 3/2001 | Joo | 365/189.04 |
| 2006/0050591 | A1 | * | 3/2006 | Park | 365/230.03 |
| 2011/0026341 | A1 | * | 2/2011 | Ko | 365/201 |

* cited by examiner

*Primary Examiner* — Douglas King
(74) *Attorney, Agent, or Firm* — Lowe Hauptman & Ham, LLP

(57) ABSTRACT

The present application discloses a memory circuit having a first decoder coupled to a first memory bank and configured to receive a plurality of address control signals and to generate a first plurality of cell selection signals responsive to the plurality of address control signals and a second decoder coupled to a second memory bank and configured to receive a plurality of inverted address control signals and to generate a second plurality of cell selection signals responsive to the plurality of inverted address control signals. The memory circuit also has an address control signal buffer coupled to the second decoder and configured to convert the plurality of address control signals into the plurality of inverted address control signals.

16 Claims, 5 Drawing Sheets

MEMORY CIRCUIT HAVING DECODING CIRCUITS AND METHOD OF OPERATING THE SAME

BACKGROUND

Semiconductor memory circuits include, for example, static random access memory (SRAM), dynamic random access memory (DRAM), read only memory (ROM), and other non-volatile memory circuits. Usually, a memory circuit is designed to be functional at a nominal operating frequency throughout a certain range of temperature, such as from −40° C. to 125° C. The nominal operating frequency is usually the worst case operating frequency of the memory circuit.

DESCRIPTION OF THE DRAWINGS

One or more embodiments are illustrated by way of example, and not by limitation, in the figures of the accompanying drawings, wherein elements having the same reference numeral designations represent like elements throughout and wherein.

DETAILED DESCRIPTION

Figure 1:
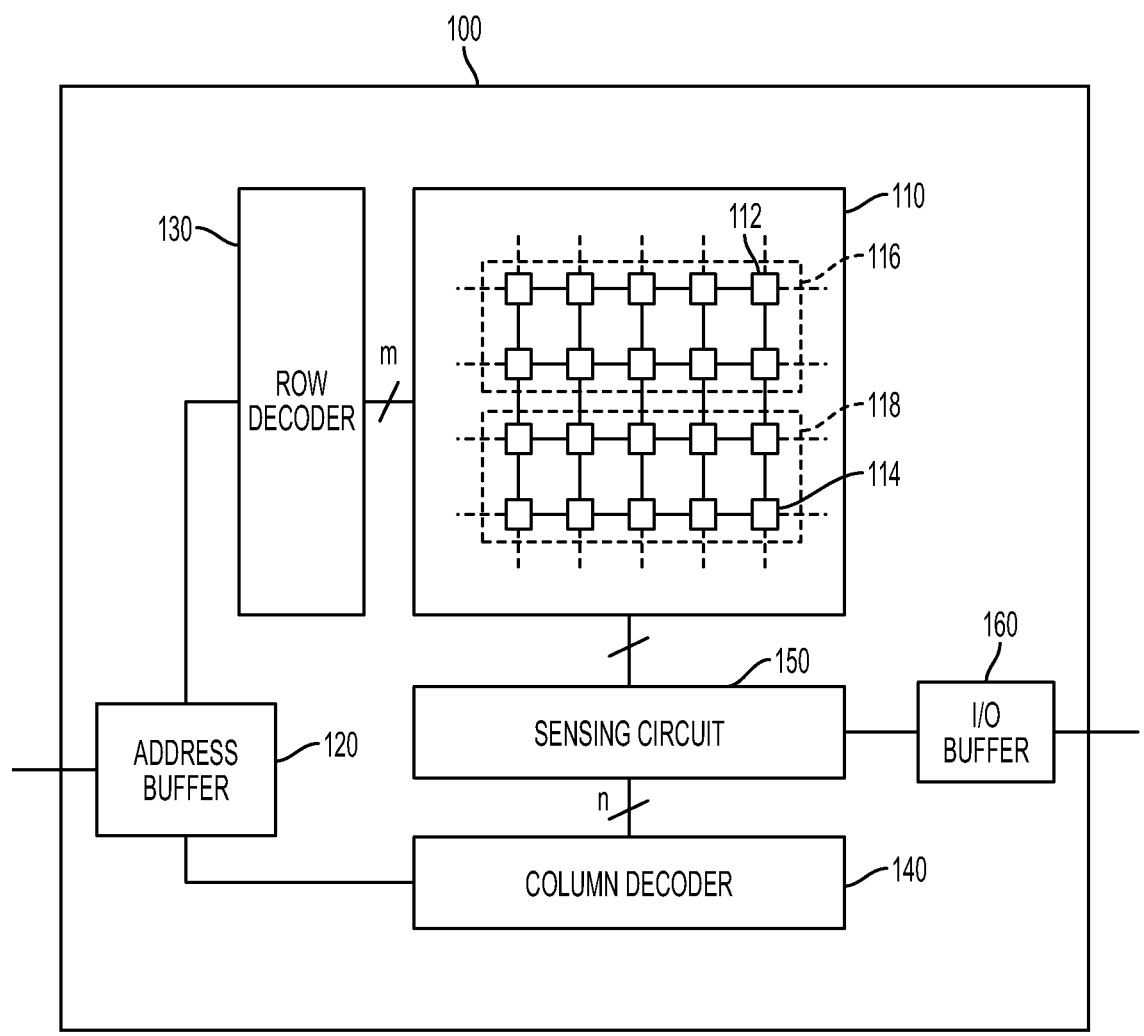
FIG. 1 is a high-level functional block diagram of a memory circuit.

FIG. 1 is a high-level functional block diagram of a memory circuit 100. Memory circuit 100 has a memory cell array 110 that includes a plurality of memory cells 112 and 114 arranged in rows and columns. The memory cells 112 and 114 are grouped into a plurality of memory banks 116 and 118. In the memory array 110 depicted in FIG. 1, memory banks 116 and 118 are just used to refer to collections or groups of memory cells 112 and 114. In some embodiments, the memory cell array 110 further has additional control circuits and signal paths to physically distinguish memory cells 112 and 114 from different memory banks 116 and 118.

Memory circuit 100 has an address buffer 120 coupled to a row decoder 130 and a column decoder 140. Address buffer 120 receives and temporarily stores an address corresponding to one or more of the memory cells in the memory cell array 110 from which a value will be read or written. In at least one embodiment, address buffer 120 rearranges the received address into address control signals and feeds at least a portion of the address control signals to the row decoder 130 and/or the column decoder 140. The row decoder 130 and the column decoder 140 convert the address control signals into a plurality of cell selection signals, such as row selection signals and column selection signals, in order to pinpoint a specific memory cell or a specific block of cells in the memory cell array 110.

Memory circuit 100 further has a sensing circuit 150 that bridges the column decoder 140 connection to the memory cell array 110. In some embodiments, the row decoder 130 outputs the row selection signals using a plurality of signal paths called word lines (m) to the memory cell array 110, and the column decoder 140 outputs the column selection signals (n) to the sensing circuit 150 in order to choose the column corresponding to the address. In some embodiments, the sensing circuit 150 is coupled to the memory cell array 110 through a plurality of data lines, such as a plurality of bit line—bit line bar pairs. Moreover, memory cell 110 has an input/output buffer 160 coupled to the sensing circuit for receiving and holding a signal received from either sensing circuit 150 or from other circuits outside the memory circuit 100.

When performing a read operation, the memory cell array 110 outputs a read-out signal having only a limited signal swing. For example, in an SRAM manufactured using a 28 nanometer (nm) process, the signal swing of the read-out signal is from 100 millivolts (mV) to 200 mV. The sensing circuit 150 amplifies the read-out signal to the voltage level at which the input/output buffer 160 recognizes a logic state of the read-out signal. In at least one embodiment, the sensing circuit 150 is capable of amplifying the read-out signal to a full swing signal, i.e., to a positive power supply voltage if the read-out signal represents a logic 1 and to a negative power supply voltage or ground if the read-out signal represents a logic 0. When performing a write operation, the sensing circuit 150 passes and/or holds an input signal received from the input/output buffer 160 for the selected column of cells. In some embodiments, the read-out signal and the input signal represent one or more bits of data.

In some embodiments, a memory circuit comprises more or less components and/or has different arrangements than the embodiment depicted in FIG. 1. For example, in some embodiments, the address buffer 120 is separated into a row address buffer and a column address buffer. In some embodiments, the function of address buffer 120 is integrated with the row decoder 130 and the column decoder 140, and thus the address buffer 120 is omitted. In yet some other embodiments, the function of the input/output buffer 160 is consolidated into the sensing circuit 150.

However, the electrical characteristics of the electrical components that are used to form the memory circuit, such as a p-channel metal-oxide-semiconductor (PMOS) field-effect transistor or an n-channel metal-oxide-semiconductor (NMOS) field-effect transistor, usually vary with the temperature. Consequently, the memory circuit which operates at a particular operating frequency at one temperature may not be functional under the same operating frequency at another temperature. A greater range of variation of the highest operating frequencies a memory circuit has over a predetermined operating temperature range usually means a lower nominal operating frequency for the memory circuit.

Figure 2:
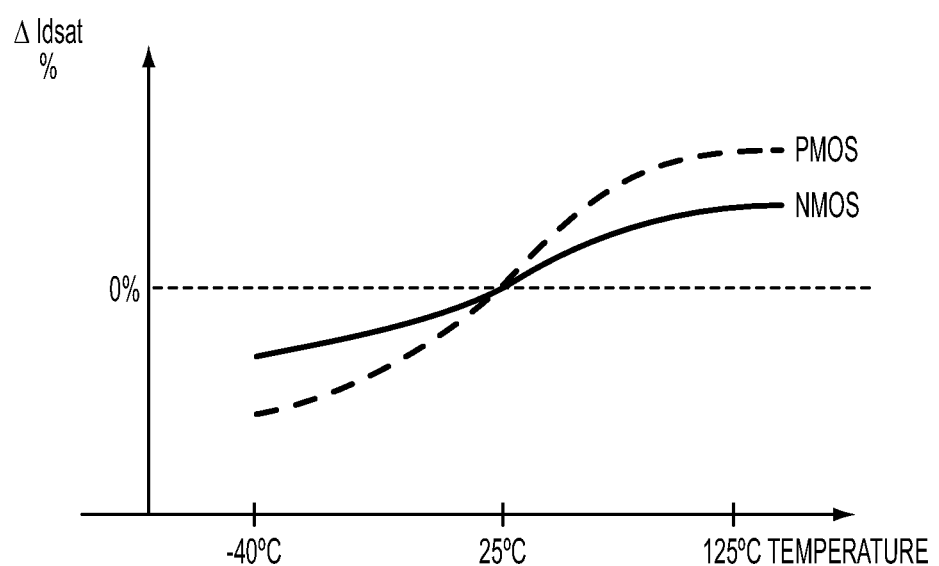
FIG. 2 is a graph of electrical characteristics of a PMOS transistor and an NMOS transistor over a temperature range according to an embodiment.

FIG. 2 is a graph of electrical characteristics of a PMOS transistor and an NMOS transistor over a temperature range according to an embodiment. In an advanced technology such as a 28 nm low-power process, temperature variation tends to have more significant impact to a PMOS transistor than an NMOS transistor. For example, in the 28 nm process mentioned above, when the temperature varies from −40° C. to 125° C., the drain saturation current Idsat of a PMOS transistor has a 35% variation, while the drain saturation current Idsat of a NMOS transistor has a 17% variation.

Further, in the same 28 nm process, within a predetermined operating temperature range, the lower the temperature, the slower operating frequency the NMOS transistor or the PMOS transistor. Thus, the worst case usually occurs at the lowest operating temperature, such as −40° C. for example. As depicted in FIG. 2, both a PMOS transistor and an NMOS transistor tend to operate at a lower operating frequency at lower temperatures. Further, the degradation of electrical characteristics of the PMOS transistor tends to be greater than that of the NMOS transistor at the lowest operating temperature. As such, in a logic circuit using the PMOS transistor and NMOS transistor depicted in FIG. 2 at the lowest operating temperature, performing a logic 1 to a logic 0 transition (i.e. the falling edge of a logic signal) is faster than performing a logic 0 to a logic 1 transition (i.e. the rising edge of a logic signal). Therefore, when using the PMOS transistor and NMOS transistor depicted in FIG. 2, using the falling edge of a logic signal as a triggering event at a critical signal stage helps to minimize the degradation of overall performance of the circuit over a predetermined operating temperature range.

Figure 3:
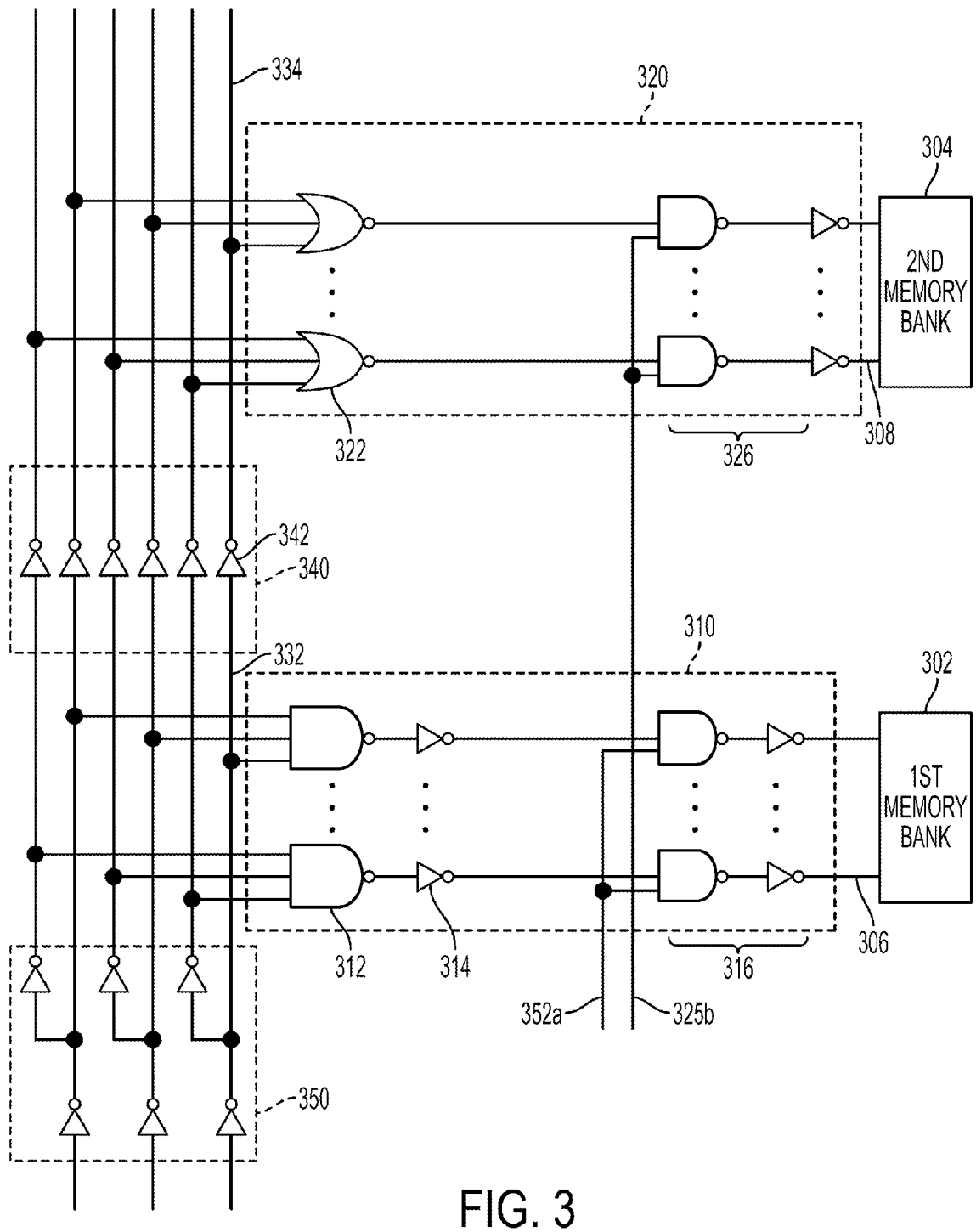
FIG. 3 is a circuit diagram of a memory circuit according to an embodiment.

FIG. 3 is a circuit diagram of a memory circuit 300 according to an embodiment. In some embodiments, memory circuit 300 has a memory cell array (110 in FIG. 1). The memory cell array is divided into groups of columns or groups of rows that are also referred to as memory banks 302 and 304. In the present embodiment, memory circuit 300 has at least two memory banks: first memory bank 302 and second memory bank 304. In some embodiments, memory circuit 300 has more than two memory banks. For example, in a 1 Mb SRAM manufactured by a 28 nm process, the memory cells are grouped into 4 to 16 memory banks.

The first memory bank 302 is controlled by a first plurality of cell selection signals carried by a plurality of cell selection lines 306. Likewise, the second memory bank 304 is controlled by a second plurality of cell selection signals carried by a plurality of cell selection lines 308. In at least one embodiment, the rising edges of the cell selection signals are more critical to the access speed of the memory banks 302 and 304 than the falling edges of the cell selection signals. In some embodiments, the cell selection lines 306 and 308 are also referred to as word lines. In the present embodiment, cell selection lines 306/308 are connected to memory banks 302/304, respectively. In some embodiments, there are one or more sensing circuits and/or passing gates positioned between the memory banks 302/304 and the cell selection lines 306/308.

In the present embodiment, memory circuit 300 has a first decoder 310 coupled to the first memory bank 302 and a second decoder 320 coupled to the second memory bank 304. The first decoder 310 receives address control signals through address control signal lines 332 and generates the first plurality of cell selection signals responsive to the address control signals. The first decoder 310 coupled to the first memory bank 302 through cell selection lines 306 by which the first plurality of cell selection signals are carried. Similarly, the second decoder 320 receives inverted address control signals through inverted address control signal lines 334 and generates the second plurality of cell selection signals responsive to the inverted address control signals. The second decoder 320 is coupled to the second memory bank 304 through cell selection lines 308 by which the second plurality of cell selection signals are carried.

In general, the address control signals (or the inverted address control signals) are required to be able to drive logic gates at the first stage of decoder 302 or 304 at a predetermined operating frequency. In addition, as a signal travels along a signal path, the inherent resistance and capacitance of the signal path degrades the driving capability of the signal. Therefore, buffers such as address control signal buffer 340 is used to ensure that the address control signals and/or inverted address control signals have the required driving capability.

In the present embodiment, memory circuit 300 further has an address control signal buffer 340 coupled to the second decoder 320 through the inverted address control signal lines 334. The address control signal buffer 340 is also coupled to the address control signal lines 332 in order to receive the plurality of address control signals. Although only one address control signal buffer 340 is depicted in FIG. 3, in some embodiments, there are two or more address control signal buffers 340 in the memory circuit 300.

The address control signal buffer 340 converts the received plurality of address control signals into the plurality of inverted address control signals. In some embodiments, address control signal buffer 340 has a plurality of signal paths, and at least one of the signal paths has a logic circuit, such as an inverter, that receives one of the address control signals from one of the address control signal lines 332, converts the received address control signal into an inverted address control signal, and outputs the inverted address control signal to one of the inverted address control signal lines 334. In some embodiments, each one of the signal paths corresponds to one of the plurality of the address control signal lines 332 and one of the plurality of the inverted address control signal lines 334. In at least one embodiment, each one of the signal path comprises an odd number of inverting logic gates. In the present embodiment, each one of the signal paths has only one inverter 342.

In some embodiments, memory circuit 300 further has an address buffer 350 that receives an address, converts the received address into a plurality of address control signals, and feeds the address control signals to one or more decoders 310 through the address control signal lines 332. In at least one embodiment, address buffer 350 is capable of receiving an N-bit address and generating 2N address control signals, where N is an integer greater than 0. In the present embodiment, address buffer 350 generates the 2N address control signals by repeating and inverting the N-bit address. For example, a bit of the received address is repeated if fed to an even number of inverters before being output. Also, a bit of the received address is inverted if fed to an odd number of inverters.

In the present embodiment depicted in FIG. 3, the address has three bits. The address buffer receives the three-bit address and converts them into 6 address control signals by repeating and inverting each bit of the address. In some embodiments, the address has more or less than three bits.

In some embodiments, the first decoder 310 has a plurality of NAND gates 312 coupled to the address control signal lines 332 in order to receive the plurality of address control signals. The decoder 310 further has a plurality of inverters 314 coupled to outputs of corresponding NAND gates 312. The combination of NAND gates 312 and the inverters 314 receives the address control signals and generates decoded address signals. In some embodiments, the outputs of the inverters 314 are coupled to the cell selection lines 306, and the decoded address signals are used as the cell selection signals for the first memory bank 302. In at least one embodiment, the decoder 310 further has a plurality of AND devices 316 that receive the decoded address signals and a first bank selection signal carried by a first bank selection signal line 352a. In the present embodiment, the AND devices 316 perform AND operations on the received decoded address signals and the received first bank selection signal in order to generate the cell selection signals for the cell selection lines 306.

In some embodiments, the first decoder 310 does not have NOR gates as the first stage because a NOR gate usually occupies a larger area on a semiconductor substrate than a NAND gate in order to have comparable driving capability.

Further, the second decoder 320 has a plurality of NOR gates 322 coupled to the inverted address control signal lines 334 in order to receive the plurality of inverted address control signals and to generate decoded address signals. The combination of NOR gates 322 and the address control signal buffer 340 has a logic effect substantially equivalent to the combination of NAND gates 312 and inverters 314 of the first decoder 310. In some embodiments, the outputs of the NOR gates 322 are coupled to the cell selection lines 308, and the decoded address signals are used as the cell selection signals for the second memory bank 304. In at least one embodiment, the decoder 320 further has a plurality of AND devices 326 that receive the decoded address signals and a second bank selection signal carried by a second bank selection signal line 352b. In the present embodiment, the AND devices 326 perform AND operations on the received decoded address signals and the received second bank selection signal in order to generate the cell selection signals for the cell selection lines 308.

Because the second decoder 320 is positioned farther from the address buffer 350 than the first decoder 310, and thus the inverted address control signals for the second decoder 320 tend to have greater degradation than that of the address control signals for the first decoder 310. In the present embodiment, compared with the address control signals, the inverted address control signals have greater levels of delay, voltage drop, and/or other types of signal degradation. As such, in the present embodiment, by having NOR gates 322 as the first stage of the second decoder 320 and applying the inverted address control signals to the NOR gates 322, the impact to the performance of the memory circuit caused by the second decoder 320 is minimized.

In some embodiments, at least one of the AND devices 316 and 326 has a NAND gate and an inverter connected to an output of the NAND gate. In at least one embodiment, each one of the AND devices 316 and 326 has the same configuration.

In some embodiments, opposite to the arrangement depicted in FIG. 3, the first decoder 306 has a plurality of NOR gates that receive the plurality of address control signals, and the second decoder 308 has a plurality of NAND gates that receive the plurality of inverted control address control signals. In some embodiments, the AND devices are replaced by buffers, pass gates, combination of NAND and NOR gates, and/or other logic circuits in order to convert the decoded address signals into cell selection signals for the first memory bank 302 and the second memory bank 304.

In some embodiments, there are more than two memory banks. At least one decoder for one of the memory banks receives and decodes the address control signals using a plurality of NAND gates. At least one other decoder for one of the memory banks receives and decodes the inverted address control signals using a plurality of NOR gates. In some embodiments, there is an address control signal buffer between every decoders, and every other decoder has NOR gates as the first stage. In at least one embodiment, except the first decoder, i.e., the decoder placed closest to the address buffer, all other decoders have NOR gates as the first stages.

In some embodiments, by converting the address control signals into inverted address control signals instead of repeating them, each signal path in the address control signal buffer 340 saves at least one inverting gate. This also means that at least one gate delay on each signal path is saved. Moreover, compared with the decoder 310 which has NAND gates 312 as the first stage, another set of inverters 314 in the decoder 320 having NOR gates 322 as the first stage is unnecessary. As a result, prior to outputting cell selection signals, each signal path from the address buffer 350 to the memory banks 302 and 304 has the same stages of gates. Therefore, although a NOR gate usually occupies a larger area on a semiconductor substrate than a NAND gate, the embodiment depicted in FIG. 3 also uses less inverters compared with the configuration lacking the inverted address control signals and uses only decoders with NAND gates as the first stages.

Further, as discussed above, the transition from logic 1 to logic 0 (i.e. the falling edge of a logic signal) is more critical to the operating frequency of a NOR gate. Also, an NMOS is more stable in operation over a predetermined operating temperature range (e.g. −40° C. to 120° C.) than a PMOS. Thus, using NOR gates 322 as the first stage of decoder 320 minimizes the degradation of performance of the decoder 320 when operating at the lowest operating temperature.

Figure 4:
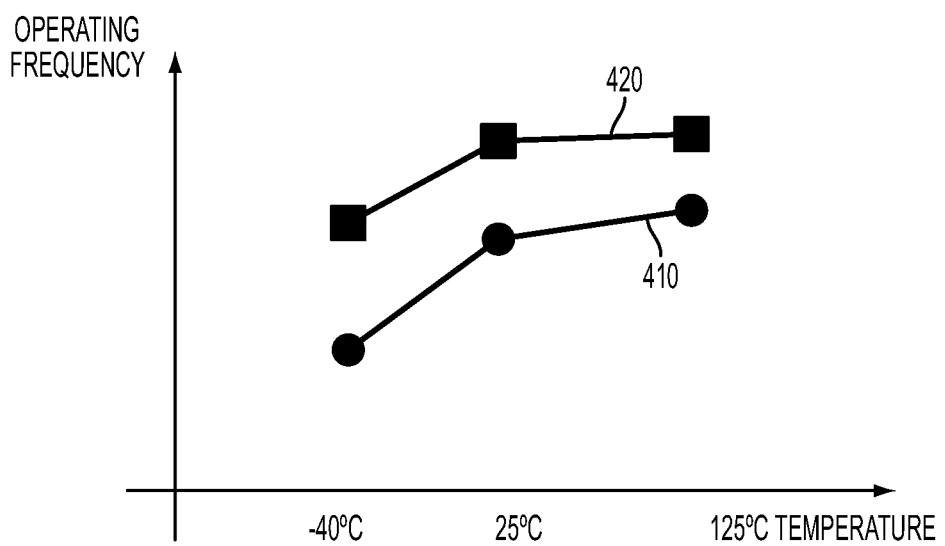
FIG. 4 is graph of operating frequencies of two memory circuits over a temperature range according to an embodiment.

FIG. 4 is a graph of operating frequencies of two memory circuits over a temperature range according to an embodiment. Compared with the configuration lacking inverted address control signals and using only decoders having NAND gates as the first stages (Line 410), the embodiment depicted in FIG. 3 (Line 420) operates at higher operating frequencies and has a more stable performance over the temperature range.

Figure 5:
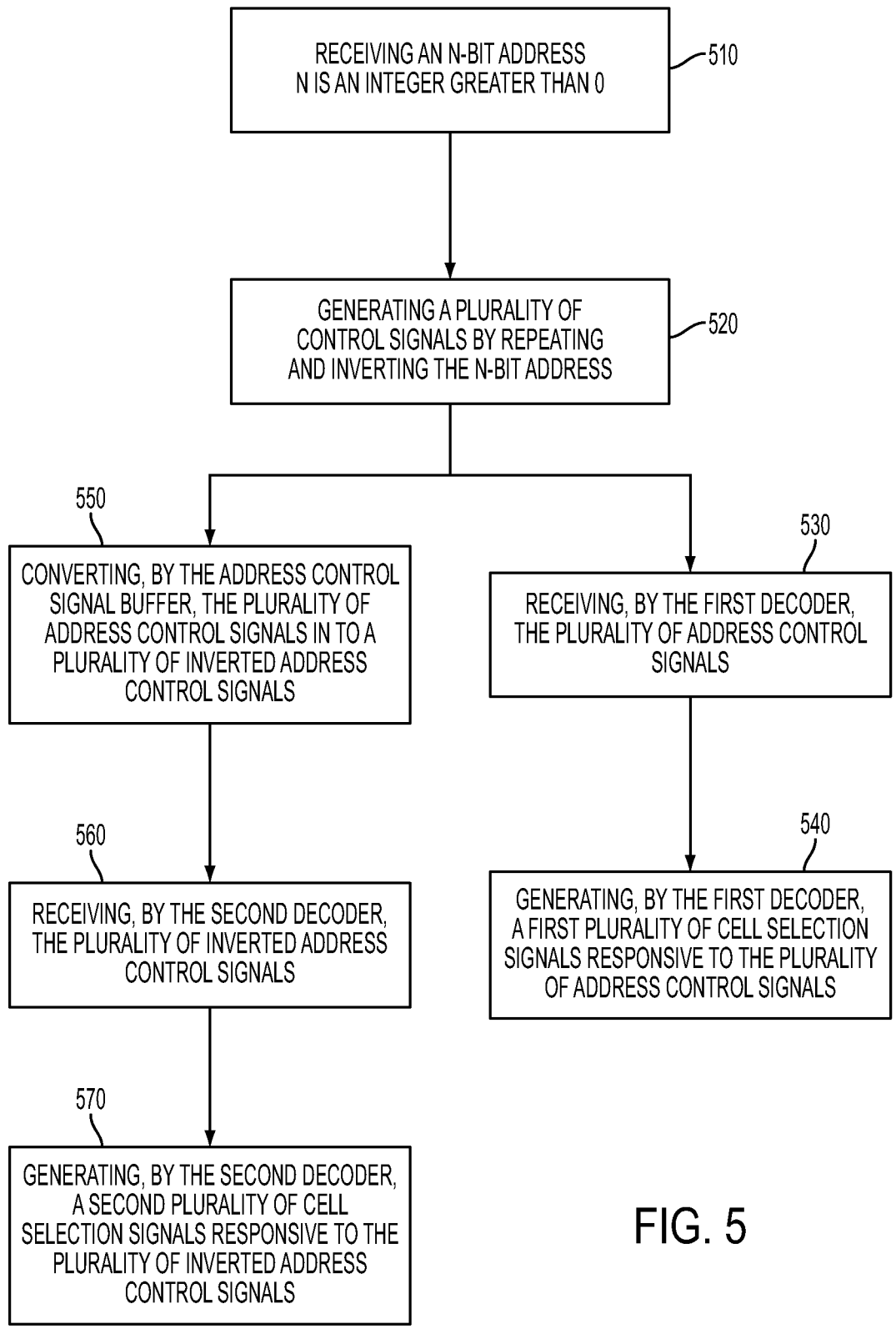
FIG. 5 is a flow chart of a method of operating a memory circuit according to an embodiment.

FIG. 5 is a flow chart of a method of operating a memory circuit according to an embodiment. A person of ordinary skill in the art will appreciate that, in some embodiments, additional operations are performed before, during, and after the method depicted in FIG. 5.

In operation 510, the memory circuit receives an N-bit address corresponding to one or more memory cells to be accessed. N is an integer greater than 0. For example, N is three in the embodiment depicted in FIG. 3. Then, in operation 520, the memory circuit generates a plurality of address control signals based on the received address. In some embodiments, an address buffer of the memory circuit generates 2N address control signals by inverting and repeating the N-bit address.

In operation 530, a first decoder of the memory cell receives the plurality of address control signals. Subsequently, in operation 540, a first decoder of the memory circuit generates a first plurality of cell selection signals responsive to the address control signals. In some embodiments, the first decoder decodes the received address control signals by performing NAND operations on the plurality of address control signals by using NAND gates.

On the other hand, in operation 550, the memory circuit also converts the plurality of address control signals into a plurality of inverted address control signals. In operation 560, a second decoder of the memory cell receives the plurality of inverted address control signals. Subsequently, in operation 570, the second decoder of the memory circuit generates a second plurality of cell selection signals responsive to the inverted address control signals. In some embodiments, the second decoder decodes the received inverted address control signals by performing NOR operations on the plurality of address control signals by using NOR gates.

In some embodiments, the generation of the first plurality of cell selection signals includes performing NOR operations on the plurality of address control signals by using NOR gates, and the generation of the second plurality of cell selection signals includes performing NAND operations on the plurality of address control signals by using NAND gates.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
    a first memory bank controlled by a first plurality of cell selection signals;
    a first decoder coupled to the first memory bank and configured to receive a plurality of address control signals through a first plurality of address control signal lines and to generate the first plurality of cell selection signals responsive to the plurality of address control signals;
    a second memory bank controlled by a second plurality of cell selection signals;
    a second decoder coupled to the second memory bank and configured to receive a plurality of inverted address control signals through a second plurality of address control signal lines and to generate the second plurality of cell selection signals responsive to the plurality of inverted address control signals; and
    an address control signal buffer coupled to the second decoder and configured to convert the plurality of address control signals from the first plurality of address control signal lines into the plurality of inverted address control signals on the second plurality of address control signal lines,
    wherein the first decoder and the second decoder are configured to have one of the following configurations:
        the first decoder comprising a plurality of NAND gates configured to receive the plurality of address control signals, and the second decoder comprising a plurality of NOR gates configured to receive the plurality of inverted address control signals; or
        the first decoder comprising a plurality of NOR gates configured to receive the plurality of address control signals, and the second decoder comprising a plurality of NAND gates configured to receive the plurality of inverted address control signals.

2. The memory circuit of claim 1, wherein the address control signal buffer comprises at least one inverter being configured to receive one of the plurality of address control signals.

3. The memory circuit of claim 2, wherein the inverter is coupled to the second decoder.

4. The memory circuit of claim 1, wherein the plurality of address control signals is 2N address control signals for an N-bit address, N is an integer greater than 0.

5. The memory circuit of claim 4, further comprising an address buffer configured to receive the N-bit address and to generate the 2N address control signals by repeating and inverting the N-bit address.

6. A decoding circuit comprising:
    a first decoder configured to receive a plurality of address control signals through a first plurality of address control signal lines and a first bank selection signal;
    a second decoder configured to receive a plurality of inverted address control signals through a second plurality of address control signal lines and a second bank selection signal; and
    an address control signal buffer coupled to the second decoder and configured to receive and convert the plurality of address control signals from the first plurality of address control signal lines into the plurality of inverted address control signals on the second plurality of address control signal lines,
    wherein the first decoder and the second decoder are configured to have one of the following configurations:
        the first decoder comprising at least one NAND gate configured to receive one of the plurality of address control signals, and the second decoder comprising at least one NOR gate configured to receive one of the plurality of inverted address control signals; or
        the first decoder comprising at least one NOR gate configured to receive one of the plurality of address control signals, and the second decoder comprising at least one NAND gate configured to receive one of the plurality of inverted address control signals.

7. The decoding circuit of claim 6, wherein the plurality of address control signals is 2N address control signals for an N-bit address, N is an integer greater than 0, and the address control signal buffer comprises 2N inverters each coupled to the second decoder and configured to receive one of the plurality of address control signals.

8. A memory circuit comprising:
    a first decoding means for generating a first plurality of cell selection signals responsive to a plurality of address control signals received through a first plurality of address control signal lines;
    a second decoding means for generating a second plurality of cell selection signals responsive to a plurality of inverted address control signals received through a second plurality of address control signal lines; and
    a buffer means for converting the plurality of address control signals from the first plurality of address control signal lines into the plurality of inverted address control signals on the second plurality of address control signal lines,
    wherein the first decoding means and the second decoding means are configured to have one of the following configurations:
        the first decoding means comprising a plurality of NAND gates configured to receive the plurality of address control signals, and the second decoding means comprising a plurality of NOR gates configured to receive the plurality of inverted address control signals; or
        the first decoding means comprising a plurality of NOR gates configured to receive the plurality of address control signals, and the second decoding means comprising a plurality of NAND gates configured to receive the plurality of inverted address control signals.

9. The memory circuit of claim 8, wherein, when the first decoding means comprises the plurality of NAND gates configured to receive the plurality of address control signals, the first decoding means further comprises:
    a plurality of inverters coupled to outputs of corresponding NAND gates of the plurality of NAND gates and configured to generate a first plurality of decoded address signals; and
    a plurality of AND devices configured to receive the first plurality of decoded address signals and a first bank selection signal and to generate the first plurality of cell selection signals.

10. The memory circuit of claim 9, wherein each one of the plurality of AND devices comprises a NAND gate and an inverter connected to an output of the NAND gate.

11. The memory circuit of claim 8, wherein, when the second decoding means comprises the plurality of NOR gates configured to receive the plurality of inverted address control signals, the second decoding means further comprises:

a plurality of AND devices configured to receive the second plurality of decoded address signals and a second bank selection signal and to generate the second plurality of cell selection signals.

12. The memory circuit of claim 11, wherein each one of the plurality of AND devices comprises a NAND gate and an inverter connected to an output of the NAND gate.

13. The memory circuit of claim 8, wherein, when the first decoding means comprises the plurality of NOR gates configured to receive the plurality of address control signals, the first decoding means further comprises:
 a plurality of AND devices configured to receive the first plurality of decoded address signals and a first bank selection signal and to generate the first plurality of cell selection signals.

14. The memory circuit of claim 13, wherein each one of the first plurality of AND devices comprises a NAND gate and an inverter connected to an output of the NAND gate.

15. The memory circuit of claim 8, wherein, when the second decoding means comprises the plurality of NAND gates configured to receive the plurality of inverted address control signals, the second decoding means further comprises:
 a plurality of inverters coupled to outputs of corresponding NAND gates of the plurality of NAND gates and configured to generate a second plurality of decoded address signals; and
 a plurality of AND devices configured to receive the second plurality of decoded address signals and a second bank selection signal and to generate the second plurality of cell selection signals.

16. The memory circuit of claim 15, wherein each one of the plurality of AND devices comprises a NAND gate and an inverter connected to an output of the NAND gate.

* * * * *